United States Patent [19]

Araki et al.

[11] Patent Number: 5,676,998
[45] Date of Patent: Oct. 14, 1997

[54] THIN FILM MAGNET, CYLINDRICAL FERROMAGNETIC THIN FILM AND PRODUCTION METHOD THEREOF

[75] Inventors: Takeshi Araki; Yoshihiro Tani; Hideo Ikeda; Masashi Okabe, all of Amagasaki, Japan

[73] Assignee: Mitsubishi Denki Kabushiki Kaisha, Tokyo, Japan

[21] Appl. No.: 525,153

[22] Filed: Sep. 8, 1995

[30] Foreign Application Priority Data

Sep. 9, 1994 [JP] Japan .................... 6-216270

[51] Int. Cl.$^6$ ............................. B05D 5/12
[52] U.S. Cl. .................... 427/132; 427/128; 427/129; 427/131; 427/250; 427/255.2; 427/294; 427/314; 427/404; 427/419.7; 428/694 R; 428/694 T; 428/694 TS; 428/704
[58] Field of Search .................... 427/585, 128, 427/129, 131, 132, 250, 255.2, 294, 314, 404, 419.7; 428/694 R, 704, 694 T, 694 TS

[56] References Cited

FOREIGN PATENT DOCUMENTS 499010  3/1992  Japan .

OTHER PUBLICATIONS

Cadieu et al, "High $_i$H$_c$ Perpendicular Anisotrophy Nd–Fe–B Sputtered Films", IEEE Transactions On Magnetics, vol. Mag–22, No. 5, Sep. 1986, pp. 752–754.

Gu et al, "Crystallization Behavior And Magnetic Properties Of Amorphous Nd–Fe–B Thin Films", Phys. Stat. Sol. (a) 120, 1990, pp. 159–167 (no month avail).

*Primary Examiner*—Bernard Pianalto
*Attorney, Agent, or Firm*—Leydig, Voit & Mayer, Ltd.

[57] ABSTRACT

A thin film magnet and a cylindrical ferromagnetic thin film having a high maximum energy product (greater than 120 kJ/m$^3$) and thus suitable for use in miniature high performance devices are provided. The thin film magnet is produced by means of physical vapor deposition. The thin film magnet is an $(Nd_{1-x}R_x)_y M_{1-y-z} B_z$ alloy having a ferromagnetic compound of the $Nd_2Fe_{14}B$ type as its main phase, wherein R is Tb, Ho, and Dy and M is Fe metal or an Fe-based alloy including at least one of Co and Ni, $0.04 \leq x \leq 0.10$, $0.11 \leq y \leq 0.15$, and $0.08 \leq z \leq 0.15$. A perpendicular magnetization film having such a composition is deposited on the side wall of a substrate in the columnar (or cylindrical) form thereby obtaining a cylindrical ferromagnetic thin film having radial anisotropy.

15 Claims, 9 Drawing Sheets

○ $(Nd_{0.96}Tb_{0.04})_{0.11}Fe_{0.81}B_{0.08}$
△ $(Nd_{0.93}Tb_{0.07})_{0.13}Fe_{0.76}B_{0.11}$
□ $(Nd_{0.90}Tb_{0.10})_{0.15}Fe_{0.70}B_{0.15}$

THIN FILM MAGNET, CYLINDRICAL FERROMAGNETIC THIN FILM AND PRODUCTION METHOD THEREOF

FIELD OF THE INVENTION

The present invention relates to a thin film magnet, a ferromagnetic thin film in the form of a cylinder, and a production method thereof. More particularly, the present invention relates to a thin film magnet and a ferromagnetic thin film in the form of a cylinder for use in small-sized or miniature devices such as miniature electric motors, microwave oscillators, and micro-machines or magnetic recording devices. The invention also relates to a production method thereof.

BACKGROUND OF THE INVENTION

In recent years, significant advancements in performance as well as in size and weight reductions have been made in various devices such as video movie cameras, cassette tape recorders, communication equipment etc. These devices need a small-sized magnet, which is usually produced by machining a block of bonded or sintered magnet material.

To improve the performance of such devices, it is desirable to employ a magnet having a high maximum energy product. On the other hand, in small-sized magnet applications, it is also required that the magnet be easily machinable into a desired shape. Although sintered magnets have a large maximum energy product ranging up to 370 kJ/m$^3$, they are very brittle and thus difficult to machine into a small size. Therefore, sintered magnets are unsuitable for use as small-sized magnets. However, bonded magnets have the advantage that they can be easily formed into a small size by machining, and thus most common millimeter-sized magnets are now of this type. However, this type of magnet has the disadvantage that the maximum energy product is as low as 40 to 120 kJ/m$^3$ for mass-produced magnets and 170 kJ/m$^3$ for Laboratory-produced magnets.

Cylindrical magnets having radial anisotropy for use in miniature motors, rotation sensors, or the like are produced by means of the in-magnetic-field formation technique or the extrusion technique. In the case of the in-magnetic-field formation technique, the inner diameter of the cylindrical magnet must be above a minimum limit so as to produce a magnetic field in a radial direction. At the present time, the practical minimum outer diameter of a magnet of this type is about 1 cm. When extrusion is employed, a mold having a minimum size is needed to ensure that the mold can withstand process pressures. Again, the current lower limit of the outer diameter of the magnet is about 1 cm. These magnets are further machined so as to obtain a good circular form with the dimensional accuracy required for particular applications. However, the above-described methods are unsuitable for producing cylindrical magnets having radial anisotropy and a size of about a millimeter or less.

In applications for micro-machines with a body size less than 1 cm$^3$ to be used in examination and repair robots for industrial and medical uses, magnets having a very small size such as a few mm$^3$ or less are required. However, such small-sized magnets cannot be produced by means of practical machining techniques.

One known technique for producing such magnets is physical vapor deposition such as by sputtering. This technique allows production of small-sized magnets with submicron accuracy. This technique allows control of various magnet characteristics, such as internal stress, crystallinity, and crystal orientation, by adjusting film deposition conditions. Utilizing various advantages of this technique, rare earth alloy-based thin film magnets have recently been developed. For example, Japanese Patent Laid-Open No. 4-99010 (1992) discloses a technique for producing a thin film magnet having a maximum energy product as large as 80 to 111 kJ/m$^3$ by properly selecting the composition of Nd—(Fe, Co, Al)—B within a certain range and also by properly selecting substrate temperature and deposition rate.

To achieve a further size reduction while maintaining device performance, it is necessary to use a magnet having a higher maximum energy product than those of the bonded magnets which are now widely used in small-sized devices. However, the maximum energy product of the conventional thin film magnet is not greater than that of the bonded magnet.

Furthermore, in the case of cylindrical magnets having radial anisotropy for use in small-sized motors or small-sized rotation sensors, the magnet must be formed in a circular shape having less than about a 10 μm deviation from an ideal circular shape and also having high radial dimensional accuracy of a similar order. In the conventional technique, as described above, a difficult machining process is required to achieve such high dimensional accuracy. The conventional technique has a further problem in that it is difficult to produce a cylindrical magnet having radial anisotropy with a size less than about a millimeter.

SUMMARY OF THE INVENTION

It is a general object of the present invention to solve the problems described above. More specifically, it is an object of the present invention to provide a thin film magnet and a production method thereof; the thin film magnet having a maximum energy product in the range of from 120 kJ/m$^3$ to 220 kJ/m$^3$, wherein the above-described lower limit is greater than the maximum energy product achieved in mass-produced bonded magnets.

It is another object of the present invention to provide a cylindrical ferromagnetic element having radial anisotropy wherein the element is formed in a circular shape having small deviations only on the order of 1 μm from an ideal circular shape and also having high radial dimensional accuracy of a similar order.

It is a further object of the present invention to provide a cylindrical ferromagnetic thin film having radial anisotropy whose size is on the order of a millimeter or less.

According to the present invention, there is provided a thin film magnet produced by means of physical vapor deposition, the thin film magnet comprising an $(Nd_{1-x}R_x)_yM_{1-y-z}B_z$ alloy having a ferromagnetic Compound of Nd$_2$Fe$_{14}$B type as its main phase, wherein R is at least one element selected from the group consisting of Tb, Ho, and Dy and M is Fe metal or an Fe-based alloy including at least one element selected from the group consisting of Co and Ni, $0.04 \leq x \leq 0.10$, $0.11 \leq y \leq 0.15$, and $0.08 \leq z \leq 0.15$. Such a thin film magnet has a high residual magnetization or coercive force and thus a high maximum energy product greater than 120 kJ/m$^3$ which is greater than that of bonded magnets or conventional thin film magnets.

According to the present invention, there is also provided a method for producing a thin film magnet by forming a magnetic thin film by physical vapor deposition on a substrate placed in a vacuum chamber. The method is characterized in that the magnetic thin film is deposited at a predetermined deposition rate and at a predetermined gas pressure while heating the substrate at a predetermined temperature so that the thin fire magnet comprises an $(Nd_{1-x}R_x)_yM_{1-y-z}B_z$ alloy having a ferromagnetic compound of the $Nd_2Fe_{14}B$ type as its main phase, wherein R is at least one element selected from the group consisting of Tb, Ho, and Dy and M is Fe metal or an Fe-based alloy including at least one element selected from the group consisting of Co and Ni, $0.04 \leq x \leq 0.10$, $0.11 \leq y \leq 0.15$, and $0.08 \leq z \leq 0.15$. Such a method can produce a thin film magnet having a high residual magnetization or coercive force and thus a maximum energy product greater than 120 kJ/m³, which is greater than that of bonded magnets or conventional thin film magnets.

Further, according to the present invention, there is provided a ferromagnetic thin film in a cylindrical form, which comprises a substrate in a cylindrical or columnar form', and a perpendicular magnetization film deposited on the side wall of the substrate', the ferromagnetic thin film having radial anisotropic magnetic properties. That is, there is provided, without the need for machining processes, a ferromagnetic thin film in cylindrical form with radial anisotropic magnetic properties that only has small deviations on the order of microns from an ideal circular shape and having radial dimensional accuracy of a similar order.

In addition, according to the present invention, there is provided a method for producing a ferromagnetic thin film in a cylindrical form having radial anisotropic magnetic properties by means of physical vapor deposition, the method including the steps of; heating a substrate in a cylindrical or columnar form to a predetermined temperature', and depositing a perpendicular magnetization film on the side wall of the substrate at a predetermined deposition rate and at a predetermined gas pressure. Such a method can produce a ferromagnetic thin film in a cylindrical form having high radially anisotropic magnetic properties, that is of a small size on the order of a millimeter or even less with high dimensional accuracy.

DESCRIPTION OF THE PREFERRED EMBODIMENTS

Figure 1:
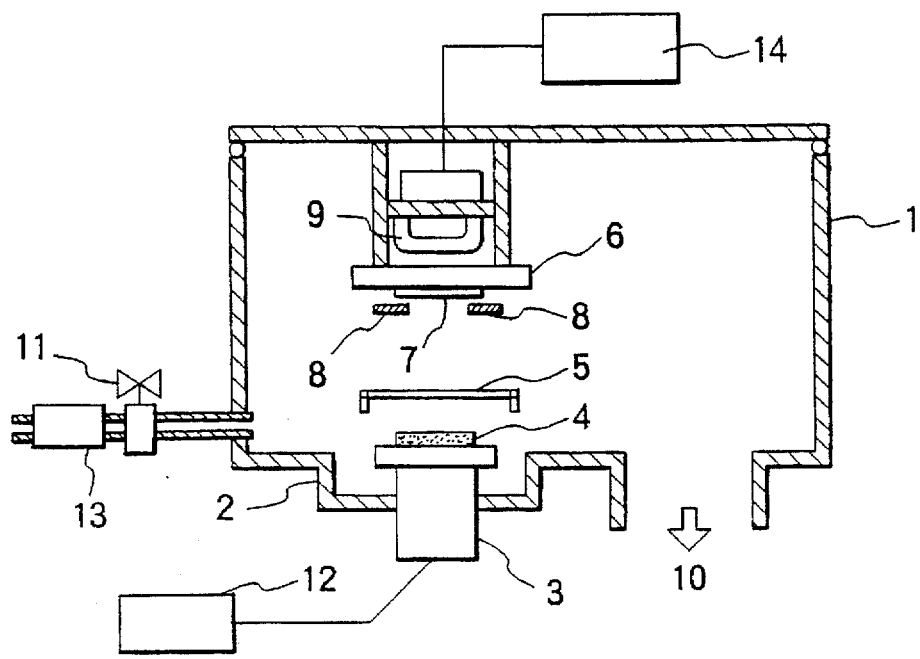
FIG. 1 shows a cross-sectional view that illustrates a film deposition apparatus for producing a thin film magnet according to an embodiment of the present invention.

The present invention will be described in further detail below referring to preferred embodiments of thin film magnets, cylindrical ferromagnetic thin films, and production methods thereof, in conjunction with the accompanying drawings. In the figures which will be referred to later, the same reference numerals denote similar or corresponding elements.

FIG. 1 is a cross-sectional view that illustrates a film deposition apparatus for producing a thin film magnet embodying the present invention. As shown in FIG. 1, there is provided a boat 2 in a vacuum chamber 1 so that a film deposition mechanism is disposed on the boat 2. In FIG. 1, the film deposition mechanism is a sputtering mechanism including a cathode electrode 3, a 3-inch target 4, and a shutter plate 5 that can be opened and closed. A substrate holder 6 is disposed at a position opposite the target 4. A 2-inch substrate 7 is attached together with a mask 8 to the substrate holder 6. There is also provided a heater 9 capable of heating the substrate 7 up to about 800° C.

Using this film deposition apparatus, a thin film magnet can be formed on the substrate 7, according to the invention as described below. The target 4 may be, for example, an (Nd, R)—M—B alloy. After evacuating the vacuum chamber 1 to a sufficiently low pressure using a pumping system 10, deposition gas, e.g., Ar gas, is introduced into the vacuum chamber 1 via a valve 11. Target 4 is then electrically discharged to initiate sputtering thereby forming a thin film magnet on the substrate 7. If the mask 8 is used, a thin film magnet is formed through the mask 8 only in the certain predetermined areas on the substrate 7. When the shutter 5 is closed, no film is deposited on the substrate 7. The power applied to the target 4, the Ar gas pressure, and the temperature of the substrate 7 can be precisely controlled by a power controller 12, a mass flow controller 13, and a temperature controller 14, respectively.

Figure 2:
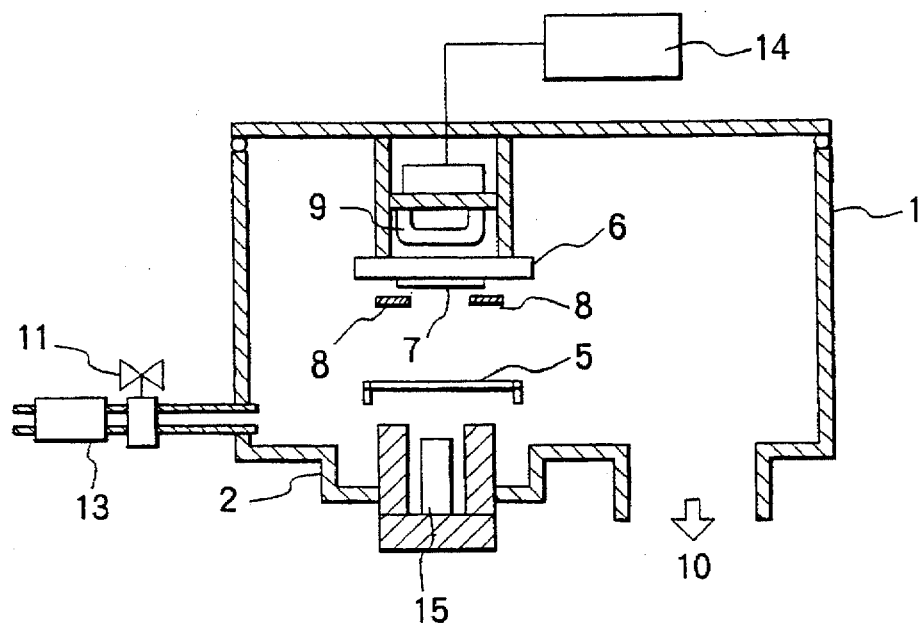
FIG. 2 shows a cross-sectional view that illustrates another film deposition apparatus for producing a thin film magnet according to the present invention.
Figure 3:
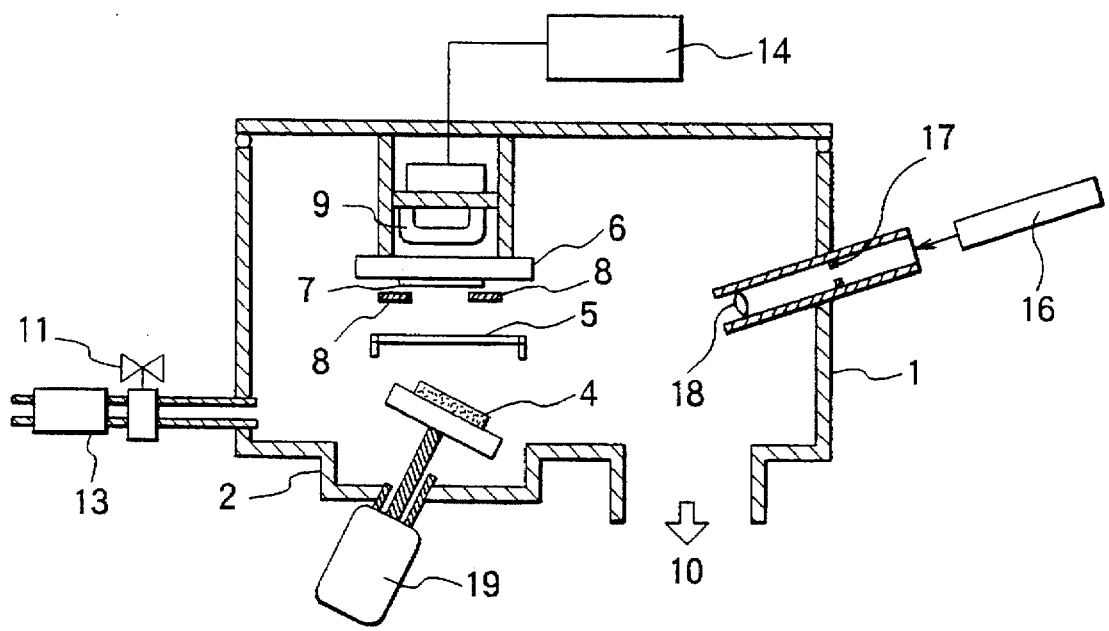
FIG. 3 shows a cross-sectional view that illustrates still another film deposition apparatus for producing a thin film magnet according to the present invention.

Instead of employing as the film deposition technique as sputtering in the above example, vacuum evaporation may also be employed. In the case that vacuum evaporation is employed, as shown in FIG. 2, an evaporation source 15 is disposed on the boat 2, and a source material such as an (Nd, R)—M—B alloy is heated so that the source material is evaporated and thus a film is deposited onto a substrate 7. A film similar to that obtained by the sputtering technique may also be obtained using a laser ablation technique as described below. As shown in FIG. 3, a laser beam is emitted by a laser source 16 and passed through a slit 17. The laser beam is then focused onto a target 4 via a lens 18 to ablate the (Nd, R)—M—B alloy target 4 which is rotated by a target rotating mechanism 19 and thus form a film on a substrate 7. As described above, the thin film magnet according to the present invention may be formed by using a physical deposition technique such as sputtering, vacuum evaporation, laser ablation, etc.

Figure 4:
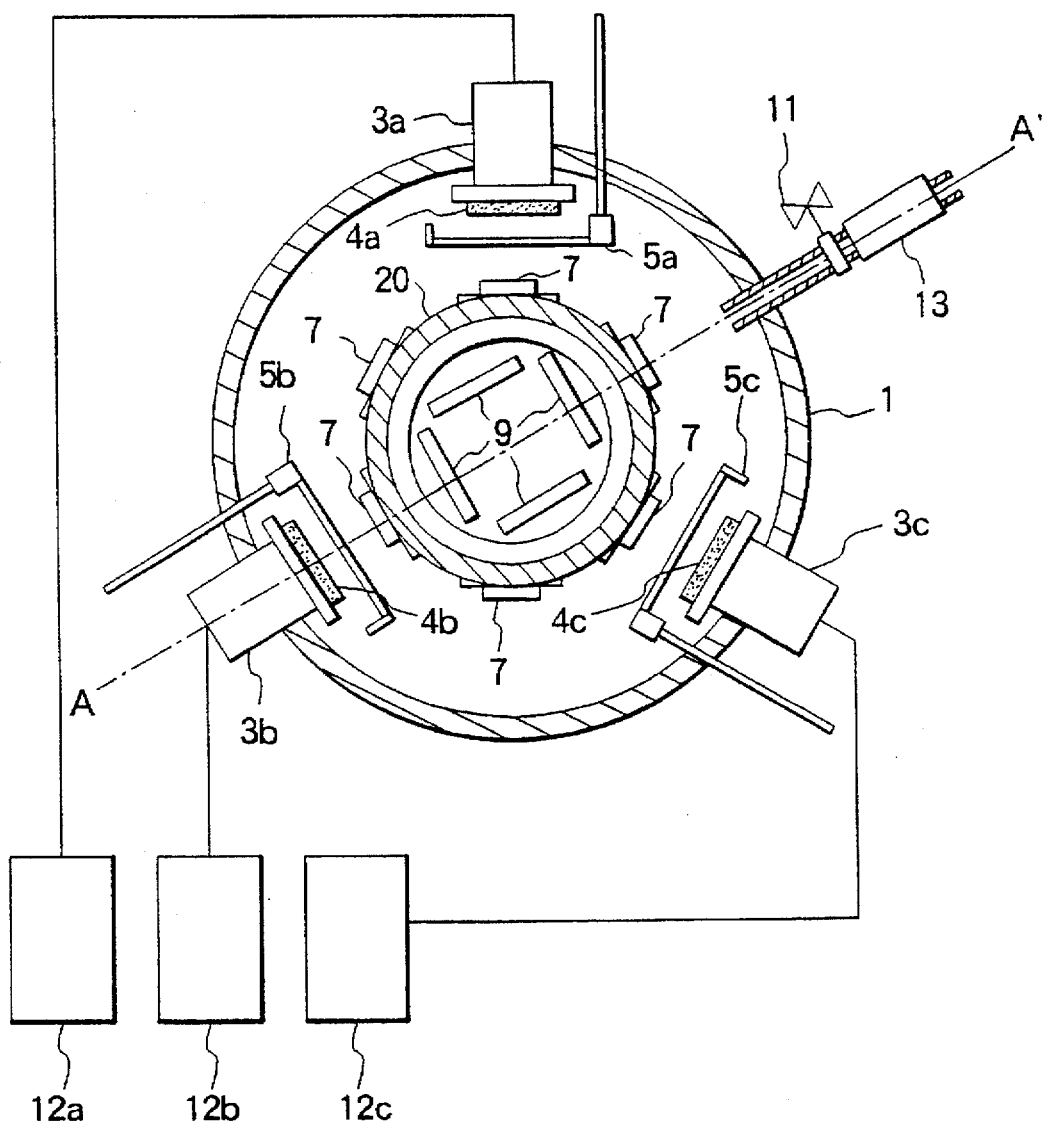
FIG. 4 shows a cross-sectional view that illustrates another film deposition apparatus for producing a thin film magnet according to the present invention.
Figure 5:
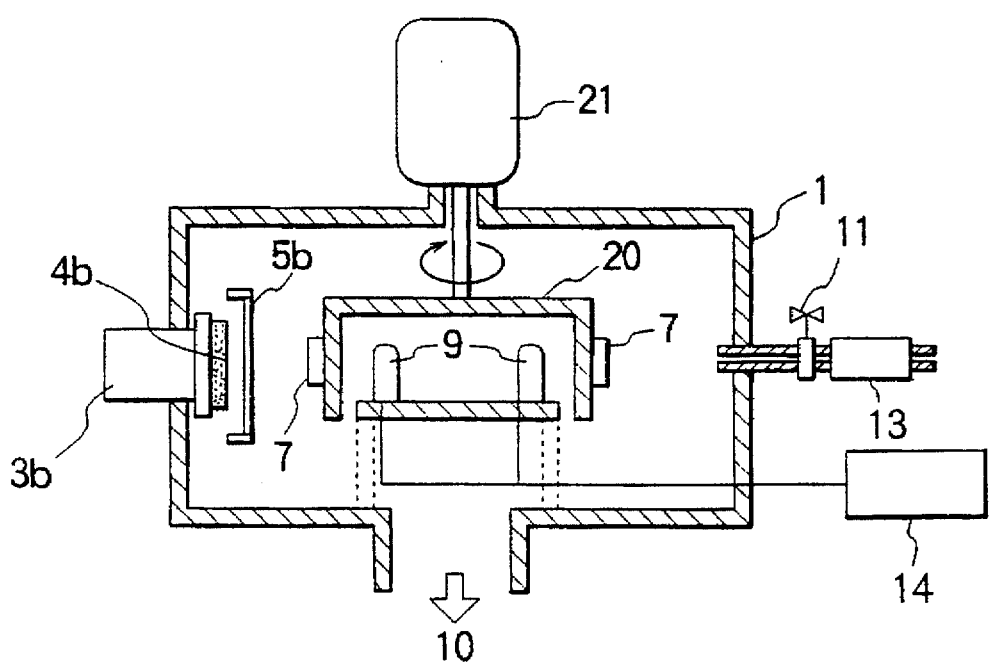
FIG. 5 shows a cross-sectional view that illustrates the film deposition apparatus of FIG. 4 taken along line A—A'.

Whereas a single deposition source is employed in the examples mentioned above, a film may also be formed using a plurality of deposition sources in a similar manner. FIG. 4 is a horizontal cross-sectional view of a representative film deposition apparatus example including a plurality of targets that can be sputtered at the same time. FIG. 5 is a cross-sectional view of the apparatus shown in FIG. 6 taken along line A—A'. As shown in FIGS. 4 and 5, three cathode electrodes 3a, 3b, and 3c are disposed in a vacuum chamber 1. A rotating substrate holder 20 is disposed at a central position of the vacuum chamber 1 wherein up to 6 pieces of 2-inch substrates 7 can be attached to the holder 20. 3-inch targets 4a, 4b, and 4c are attached to the respective cathode electrodes 3a, 3b, and 3c so that these targets 4a, 4b, and 4c can be discharged at the same time while the rotating substrate holder 20 is rotated by a motor 21, thereby sputtering these targets and forming a thin film having a composition which is a mixture of the compositions of these targets.

The cathode electrodes 3a, 3b, 3c are connected to separate power controllers 12a, 12b, 12c, respectively, so that the power applied to these targets 4a, 4b, and 4c can be controlled independently by the power controllers 12a, 12b, and 12c. This allows deposition of a thin film having various compositions. Deposition gas used for film deposition is introduced into a vacuum chamber 1 via a valve 11 wherein the flow rate of the gas is controlled by a mass flow controller 13. The substrates 7 are heated by heaters 9 disposed inside the rotating substrate holder 20 while the temperatures of the substrates 7 are controlled by a temperature controller 14. Shutters 5a, 5b, and 5c, that can be opened and closed, are disposed between the rotating substrate holder 20 and the respective targets 4a, 4b, and 4c. Thus, when a shutter is closed, no source material corresponding to the closed shutter is deposited on the substrates 7 even during a sputtering process. This deposition apparatus makes it possible to separately control the composition of a ternary system. Thus, it is possible to easily control the composition of the thin film magnet such as the $(Nd_{1-x}R_x)_yM_{1-y-z}B_z$ thin film magnet according to the present invention.

When the resultant composition of the thin film produced in the physical vapor deposition method described above is in a certain composition range including the composition of the $(Nd_{1-x}R_x)_yM_{1-y-z}B_z$ alloy being in the ranges of $0.04 \leq x \leq 0.10$, $0.11 \leq y \leq 0.15$, and $0.08 \leq z \leq 0.15$, wherein R is at least one element selected from the group consisting of Tb, Ho, and Dy and M is Fe metal or an Fe-based alloy including at least one element selected from the group consisting of Co and Ni, the thin film includes an $Nd_2Fe_{14}B$-based ferromagnetic phase as a main phase, and the C-axis of the obtained crystal is oriented normal to the deposition film plane so that the film becomes a perpendicular magnetization film having a strong magnetic anisotropy in the normal direction to the film plane. If the film is formed so that the resultant composition is within the composition range exemplified above, the film has residual magnetization and coercive force greater than bonded magnets or conventional thin film magnets and thus the film has a maximum energy product greater than 120 kJ/m$^3$.

Whereas the film deposition may be performed at any substrate temperature greater than the crystallization temperature, it is preferable that the substrate temperature may be in the range in which the deposited film has a stable $Nd_2Fe_{14}B$-based ferromagnetic phase and the C-axis of the obtained crystal be oriented perpendicular to the film plane. By way of example, Table 1 shows material characteristics of $(Nd_{0.93}Tb_{0.07})_{0.13}Fe_{0.76}B_{0.11}$ thin films (crystallization temperature: 480° C.) deposited at various substrate temperatures. As an be seen from this table, if a film is deposited at a substrate temperature in the range of about 500° to 630° C., which is higher than the crystallization temperature, the film includes an $Nd_2Fe_{14}B$-based ferromagnetic phase as a main phase and the C-axis of the crystal is oriented perpendicular to the film plane. Thus, it is possible to obtain a thin film having a high maximum energy product.

TABLE 1

| SAMPLE | SUB. TEMP. (°C.) | MAIN PHASE | C-AXIS ORIENT. | MAXIMUM ENERGY PRODUCT (kJ/m$^3$) | CRYSTALLI- ZATION | MAIN PHASE | C-AXIS ORIENT. | MAXIMUM ENERGY MAXIMUM (kJ/m$^3$) |
|---|---|---|---|---|---|---|---|---|
| 1 | 300 | amorphous | x | ≦1 | 530° C. × 30 min | Nd$_2$Fe$_{14}$B type crystal | x | 68 |
| 2 | 400 | amorphous | x | ≦1 | 530° C. × 30 min | Nd$_2$Fe$_{14}$B type crystal | x | 73 |
| 3 | 420 | amorphous | x | ≦1 | 530° C. × 30 min | Nd$_2$Fe$_{14}$B type crystal | o | 158 |
| 4 | 480 | amorphous | x | ≦1 | 530° C. × 30 min | Nd$_2$Fe$_{14}$B type crystal | o | 166 |
| 5 | 500 | Nd$_2$Fe$_{14}$B type crystal | o | 165 | — | — | — | — |

TABLE 1-continued

| SAMPLE | SUB. TEMP. (°C.) | MAIN PHASE | C-AXIS ORIENT. | MAXIMUM ENERGY PRODUCT (kJ/m³) | CRYSTALLI-ZATION | MAIN PHASE | C-AXIS ORIENT. | MAXIMUM ENERGY MAXIMUM (kJ/m³) |
|---|---|---|---|---|---|---|---|---|
| 6 | 550 | Nd$_2$Fe$_{14}$B type crystal | o | 174 | — | — | — | — |
| 7 | 600 | Nd$_2$Fe$_{14}$B type crystal | o | 163 | — | — | — | — |
| 8 | 630 | Nd$_2$Fe$_{14}$B type crystal | o | 155 | — | — | — | — |
| 9 | 700 | Nd$_2$Fe$_{14}$B type crystal | x | 97 | — | — | — | — |

In the case of Sample 4 shown in Table 1, since the film was deposited at a temperature near the crystallization temperature, the film did not crystallize well and thus the film included an amorphous phase as a main phase. However, even in this case, if a crystallization treatment is performed on the film by heating the film in an electric furnace or the like at a temperature higher than the crystallization temperature thereby crystallizing the film into an Nd$_2$Fe$_{14}$B-based ferromagnetic phase, it is possible to obtain a perpendicular magnetization film. As in the case of Sample 3, even when the film is deposited at a temperature lower than the crystallization temperature, if the temperature difference is less than 60° C., it is possible to obtain a perpendicular magnetization film by performing a crystallization treatment. This results in a thin film having a high maximum energy product similar to that of a thin film deposited at a temperature in the range from 500° C. to 630° C. However, if the film is deposited at a substrate temperature 80° C. or more lower than the crystallization temperature, the C-axis of the crystal will no longer be oriented in a direction across the film thickness even after a crystallization treatment is performed. Thus, in this case, the resultant thin film will show isotropic magnetic properties. On the other hand, if a film is deposited at a temperature higher than 700° C., the orientation of the C-axis of the crystal is disturbed. For this reason, extremely high substrate temperatures are undesirable.

According to the present invention, as described above, it is possible to produce a high-quality thin film magnet even at a substrate temperature lower than the crystallization temperature by performing a crystallization treatment. This allows a thin film magnet to be deposited over a very wide range of temperatures.

Figure 6:
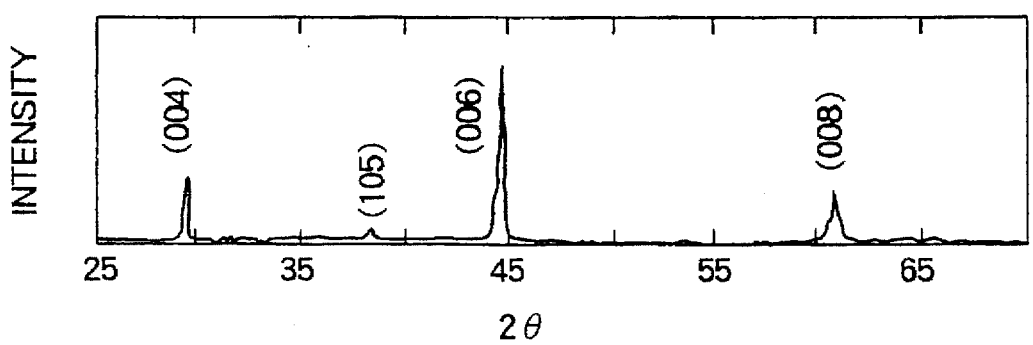
FIG. 6 shows a diagram that illustrates an X-ray diffraction pattern of a thin film magnet according to the present invention.

In Table 1, the orientation of the C-axis is evaluated according to the criterion that if the X-ray diffraction pattern of the thin film magnet shown in FIG. 6 has a ratio ($\Sigma I_{(00m)} + I_{(105)})/\Sigma I$, that is the ratio of the sum of the C-plane peak intensity $I_{(00m)}$(m=4, 6, 8 or 10) and the (105) peak intensity $I_{(105)}$ to the total peak intensity $\Sigma I$ of the Nd$_2$Fe$_{14}$B-based compound, greater than 0.9, then the orientation is regarded as good (o), and regarded as bad (x) in the opposite case. This criterion will also be employed in Tables 2, 3, and 4 described later.

As for the deposition rate, it is possible to form a film at a few μm/hr without any problems as in the case of the deposition of conventional magnetic thin films.

However, as can be seen from Table 2 showing the material characteristics of (Nd$_{0.93}$Tb$_{0.07}$)$_{0.13}$Fe$_{0.76}$B$_{0.11}$ thin films, if a film is deposited at a deposition rate of 40 μm/hr or more, the orientation of the C-axis of the crystal is degraded, and thus such a high deposition rate is undesirable.

TABLE 2

| SAMPLE | DEPOSITION RATE (μm/hr) | C-AXIS ORIENTATION | MAXIMUM ENERGY PRODUCT (kJ/m³) |
|---|---|---|---|
| 1 | 0.05 | o | 162 |
| 2 | 0.1 | o | 169 |
| 3 | 0.5 | o | 170 |
| 4 | 1.0 | o | 172 |
| 5 | 5.0 | o | 170 |
| 6 | 8.0 | o | 166 |
| 7 | 10.0 | o | 165 |
| 8 | 20.0 | o | 160 |
| 9 | 40.0 | x | 86 |

The substrate material of the invention is not particularly limited. As can be seen from Table 3, an (Nd$_{0.93}$Tb$_{0.07}$)$_{0.13}$Fe$_{0.76}$B$_{0.11}$ thin film having good characteristics can be deposited on various types of substrates such as glass, metal, alloy oxides, nitrides, etc. In Table 3, the term "sputtered film" denotes a substrate of the type that was obtained by sputtering Fe, Fe—Si, Fe—Co, or Fe-Ni on a quartz glass substrate.

TABLE 3

| SAMPLE | SUBSTRATE MATERIAL | SUBSTRATE TYPE | C-AXIS ORIENTATION | MAXIMUM ENERGY PRODUCT (kJ/m³) |
|---|---|---|---|---|
| 1 | quartz glass | bulk (0.5 mm) | o | 165 |
| 2 | Si | single crystal wafer (0.35 mm) | o | 161 |
| 3 | Al$_2$O$_3$ | bulk (0.8 mm) | o | 163 |
| 4 | MgO | bulk (0.8 mm) | o | 166 |
| 5 | TiN | bulk (0.8 Mm) | o | 170 |
| 6 | W | bulk (0.5 mm) | o | 169 |
| 7 | Fe | sputtered film (0.2 μm) | o | 161 |
| 8 | Fe—Si | sputtered film (0.2 μm) | o | 160 |
| 9 | Fe—Co | sputtered film (0.2 μm) | o | 167 |
| 10 | Fe—Ni | sputtered film (0.2 μm) | o | 159 |

When a film is deposited using the sputtering technique, the gas pressure during a deposition process may be in the range of from a few mm Pa to a few Pa without any problems as in common techniques for depositing magnetic thin films. However, as can be seen from Table 4 showing the material characteristics of $(Nd_{0.93}Tb_{0.07})_{0.13}Fe_{0.76}B_{0.11}$ thin films, if a film is deposited at a gas pressure of 40 Pa, the orientation of the C-axis of the crystal is degraded. Thus, too high a gas pressure is undesirable.

TABLE 4

| SAMPLE | Ar GAS PRESSURE (Pa) | C-AXIS ORIENTATION | MAXIMUM ENERGY PRODUCT (kJ/m³) |
|---|---|---|---|
| 1 | 0.05 | o | 170 |
| 2 | 0.50 | o | 168 |
| 3 | 2.00 | o | 169 |
| 4 | 5.00 | o | 166 |
| 5 | 8.00 | o | 165 |
| 6 | 20.0 | o | 161 |
| 7 | 40.0 | x | 92 |

Referring now to specific examples, the present invention will be described in further detail below.

EXAMPLE 1

In the film deposition apparatus shown in FIG. 4, Nd—R (R is Tb, Ho, or Dy) serving as the target 4a, Fe metal as the target 4b, and an FeB alloy as the target 4c were attached to the cathode electrodes 3a, 3b, and 3c, respectively. The target 4a was made in such a manner that R metal chips having dimensions of 5 mm×5 mm×1 mm (thickness) was disposed on a 3 inch diameter Nd metal target. A 12 mm×12 mm×0.5 mm (thickness) quartz glass substrate was attached to the rotating substrate holder 20. The inside of the vacuum chamber 1 was then evacuated to a pressure less than $1\times10^{-4}$ Pa via the pumping system 10. The substrate 7 was then heated by the heater 9 up to 590° C.

After the temperature of the substrate 7 became stable, Ar gas was introduced into the vacuum chamber 1, and the gas pressure was maintained at 8 Pa. Substrate holder 20 was rotated by the motor 21. While maintaining the shutters 5a, 5b, and 5c in a closed state, voltages were applied to the targets 4a, 4b, and 4c to discharge these targets. Under this condition, the targets were sputtered for 5 to 15 minutes so as to remove the oxides present on the surfaces of the targets. The shutters 5a, 5b, and 5c were then opened and thus film deposition onto the substrate 7 was begun. The film deposition was performed at a deposition rate of 8 μm/hr for a predetermined time period. After the completion of the film deposition, the discharging of the targets, the supplying of Ar gas, and the heating of the substrate by means of the heater were all stopped simultaneously. While evacuating the inside of the vacuum chamber 1, the sample remaining in the vacuum chamber 1 was cooled at a slow cooling rate. Thus, a thin film of $(Nd_{1-x}Tb_x)_yFe_{1-y-z}B_z$ having a thickness of about 2 μm was obtained.

The composition of the thin film magnet was controlled by separately adjusting the power applied to each target so that desired values were obtained for y and z in the composition formula and also by adjusting the number of R chips so that x had a desired value.

Table 5 shows the magnetic characteristics measured perpendicular to the film plane for obtained $(Nd_{1-x}Tb_x)_yFe_{1-y-z}B_z$ thin film magnets, wherein, R was Tb.

TABLE 5

| SAMPLE | COMPOSITION | RESIDUAL MAGNETIZATION (T) | COERCIVE FORCE | MAXIMUM ENERGY PRODUCT (kJ/m³) |
|---|---|---|---|---|
| 1 | $(Nd_{0.96}Tb_{0.04})_{0.11}Fe_{0.81}B_{0.08}$ | 1.09 | 528 | 156 |
| 2 | $(Nd_{0.96}Tb_{0.04})_{0.11}Fe_{0.74}B_{0.15}$ | 1.00 | 712 | 143 |
| 3 | $(Nd_{0.96}Tb_{0.04})_{0.13}Fe_{0.76}B_{0.11}$ | 1.03 | 672 | 161 |
| 4 | $(Nd_{0.96}Tb_{0.04})_{0.15}Fe_{0.77}B_{0.08}$ | 1.02 | 600 | 145 |
| 5 | $(Nd_{0.96}Tb_{0.04})_{0.15}Fe_{0.70}B_{0.15}$ | 0.92 | 768 | 128 |
| 6 | $(Nd_{0.93}Tb_{0.07})_{0.11}Fe_{0.81}B_{0.08}$ | 1.06 | 624 | 194 |
| 7 | $(Nd_{0.93}Tb_{0.07})_{0.11}Fe_{0.78}B_{0.11}$ | 1.02 | 696 | 170 |
| 8 | $(Nd_{0.93}Tb_{0.07})_{0.11}Fe_{0.74}B_{0.15}$ | 0.97 | 800 | 157 |
| 9 | $(Nd_{0.93}Tb_{0.07})_{0.13}Fe_{0.79}B_{0.08}$ | 1.02 | 656 | 184 |
| 10 | $(Nd_{0.93}Tb_{0.07})_{0.13}Fe_{0.76}B_{0.11}$ | 1.00 | 736 | 165 |
| 11 | $(Nd_{0.93}Tb_{0.07})_{0.13}Fe_{0.72}B_{0.15}$ | 0.93 | 832 | 149 |
| 12 | $(Nd_{0.93}Tb_{0.07})_{0.15}Fe_{0.77}B_{0.08}$ | 1.00 | 688 | 172 |
| 13 | $(Nd_{0.93}Tb_{0.07})_{0.15}Fe_{0.74}B_{0.11}$ | 0.97 | 768 | 157 |
| 14 | $(Nd_{0.93}Tb_{0.07})_{0.15}Fe_{0.70}B_{0.15}$ | 0.88 | 840 | 141 |
| 15 | $(Nd_{0.90}Tb_{0.10})_{0.11}Fe_{0.81}B_{0.08}$ | 1.01 | 656 | 153 |
| 16 | $(Nd_{0.90}Tb_{0.10})_{0.11}Fe_{0.74}B_{0.15}$ | 0.91 | 840 | 132 |
| 17 | $(Nd_{0.90}Tb_{0.10})_{0.13}Fe_{0.76}B_{0.11}$ | 0.95 | 760 | 144 |
| 18 | $(Nd_{0.90}Tb_{0.10})_{0.15}Fe_{0.77}B_{0.08}$ | 0.94 | 704 | 135 |
| 19 | $(Nd_{0.90}Tb_{0.10})_{0.15}Fe_{0.70}B_{0.15}$ | 0.86 | 880 | 133 |
| COMP. 1 | Nd—Fe—B based bonded | 0.70 | 400 | 90 |
| COMP. 2 | Nd—Fe—B based bonded | 0.79 | 840 | 105 |
| COMP. 3 | Nd—Fe—B based bonded | 0.69 | 740 | 85 |
| COMP. 4 | $Nd_{0.11}Fe_{0.81}B_{0.08}$ | 1.12 | 248 | 71 |
| COMP. 5 | $Nd_{0.11}Fe_{0.74}B_{0.15}$ | 1.04 | 544 | 132 |
| COMP. 6 | $Nd_{0.13}Fe_{0.76}B_{0.11}$ | 1.03 | 336 | 116 |
| COMP. 7 | $Nd_{0.15}Fe_{0.77}B_{0.08}$ | 1.05 | 280 | 85 |
| COMP. 8 | $Nd_{0.15}Fe_{0.70}B_{0.15}$ | 0.94 | 600 | 119 |
| COMP. 9 | $Nd_{0.19}Fe_{0.63}B_{0.18}$ | 0.68 | 902 | 62 |
| COMP. 10 | $(Nd_{0.98}Tb_{0.02})_{0.11}Fe_{0.81}B_{0.08}$ | 1.10 | 336 | 106 |
| COMP. 11 | $(Nd_{0.98}Tb_{0.02})_{0.11}Fe_{0.74}B_{0.15}$ | 1.02 | 608 | 143 |
| COMP. 12 | $(Nd_{0.98}Tb_{0.02})_{0.13}Fe_{0.76}B_{0.11}$ | 1.04 | 424 | 131 |
| COMP. 13 | $(Nd_{0.98}Tb_{0.02})_{0.15}Fe_{0.77}B_{0.08}$ | 1.04 | 312 | 95 |
| COMP. 14 | $(Nd_{0.98}Tb_{0.02})_{0.15}Fe_{0.70}B_{0.15}$ | 0.93 | 648 | 127 |
| COMP. 15 | $(Nd_{0.85}Tb_{0.15})_{0.11}Fe_{0.81}B_{0.08}$ | 0.98 | 696 | 144 |

TABLE 5-continued

| SAMPLE | COMPOSITION | RESIDUAL MAGNETIZATION (T) | COERCIVE FORCE | MAXIMUM ENERGY PRODUCT (kJ/m$^3$) |
|---|---|---|---|---|
| COMP. 16 | $(Nd_{0.85}Tb_{0.15})_{0.11}Fe_{0.74}B_{0.15}$ | 0.87 | 872 | 113 |
| COMP. 17 | $(Nd_{0.85}Tb_{0.15})_{0.13}Fe_{0.76}B_{0.11}$ | 0.89 | 800 | 123 |
| COMP. 18 | $(Nd_{0.85}Tb_{0.15})_{0.15}Fe_{0.77}B_{0.08}$ | 0.88 | 736 | 108 |
| COMP. 19 | $(Nd_{0.85}Tb_{0.15})_{0.15}Fe_{0.70}B_{0.15}$ | 0.77 | 920 | 91 |
| COMP. 20 | $(Nd_{0.93}Tb_{0.07})_{0.09}Fe_{0.85}B_{0.06}$ | 1.02 | 72 | 23 |
| COMP. 21 | $(Nd_{0.93}Tb_{0.07})_{0.09}Fe_{0.83}B_{0.08}$ | 0.96 | 72 | 22 |
| COMP. 22 | $(Nd_{0.93}Tb_{0.07})_{0.09}Fe_{0.80}B_{0.11}$ | 0.89 | 80 | 25 |
| COMP. 23 | $(Nd_{0.93}Tb_{0.07})_{0.09}Fe_{0.76}B_{0.15}$ | 0.86 | 240 | 43 |
| COMP. 24 | $(Nd_{0.93}Tb_{0.07})_{0.09}Fe_{0.74}B_{0.17}$ | 0.85 | 200 | 32 |
| COMP. 25 | $(Nd_{0.93}Tb_{0.07})_{0.11}Fe_{0.83}B_{0.06}$ | 1.07 | 208 | 52 |
| COMP. 26 | $(Nd_{0.93}Tb_{0.07})_{0.11}Fe_{0.72}B_{0.17}$ | 0.84 | 680 | 95 |
| COMP. 27 | $(Nd_{0.93}Tb_{0.07})_{0.13}Fe_{0.81}B_{0.06}$ | 1.04 | 232 | 61 |
| COMP. 28 | $(Nd_{0.93}Tb_{0.07})_{0.13}Fe_{0.70}B_{0.17}$ | 0.80 | 696 | 96 |
| COMP. 29 | $(Nd_{0.93}Tb_{0.07})_{0.15}Fe_{0.79}B_{0.06}$ | 1.00 | 256 | 71 |
| COMP. 30 | $(Nd_{0.93}Tb_{0.07})_{0.15}Fe_{0.68}B_{0.17}$ | 0.73 | 704 | 77 |
| COMP. 31 | $(Nd_{0.93}Tb_{0.07})_{0.17}Fe_{0.77}B_{0.06}$ | 0.88 | 360 | 85 |
| COMP. 32 | $(Nd_{0.93}Tb_{0.07})_{0.17}Fe_{0.75}B_{0.08}$ | 0.86 | 600 | 108 |
| COMP. 33 | $(Nd_{0.93}Tb_{0.07})_{0.17}Fe_{0.72}B_{0.11}$ | 0.79 | 704 | 96 |
| COMP. 34 | $(Nd_{0.93}Tb_{0.07})_{0.17}Fe_{0.68}B_{0.15}$ | 0.72 | 760 | 84 |
| COMP. 35 | $(Nd_{0.93}Tb_{0.07})_{0.17}Fe_{0.66}B_{0.17}$ | 0.67 | 840 | 73 |

As can be seen from Table 5, the samples according to the present invention all show high coercive force and residual magnetization and thus high maximum energy products of 128 to 194 kJ/m$^3$ in the composition ranges of $0.04 \leq x \leq 0.10$, $0.11 \leq y \leq 0.15$, and $0.08 \leq z \leq 0.15$. These values are greater than those of bonded magnets which are also shown in Table 5 as Comparative Samples 1 to 3 and greater than those of conventional Nd-Fe-B thin film magnets shown as Comparative Samples 4 to 9. However, if the composition x fails to fall within the range of $0.04 \leq x \leq 0.10$ specified by the present invention, the maximum energy product more than 120 kJ/m$^3$ is not always obtained as in the case of Comparative Samples 10 to 19 where x=0.02 or x=0.15.

In the case of samples where x=0.02, though slight improvement was found compared with that of the conventional thin film magnets, their coercive force was still not sufficient and thus it is not possible to obtain a maximum energy product greater than 120 kJ/m$^3$ for some samples.

On the other hand, in the case of the samples where x=0.15, though they have a sufficient coercive force, a great reduction occurs in residual magnetization. As a result, it is difficult to obtain a maximum energy product greater than 120 kJ/m$^3$ for some samples. Furthermore, even in the case where $0.04 \leq x \leq 0.10$, if y and z values do not satisfy the composition requirements $0.11 \leq y \leq 0.15$ and $0.08 \leq z \leq 0.15$, it is impossible to obtain a maximum energy product greater than 120 kJ/m$^3$ as in the case of Comparative Samples 20 to 35. If the composition deviates from the optimum range to low levels of Nd and B, $\alpha$-Fe will be precipitated in a film and thus it is impossible to obtain a sufficient coercive force. On the other hand, if the composition deviates from the optimum range to a high level of Nd, the anisotropic magnetic properties perpendicular to the film plane of thin film magnets are disturbed and thus both residual magnetization and coercive force levels fall. In the case where the composition deviates from the optimum range to a higher level of B, a great reduction in residual magnetization occurs. To achieve a maximum energy product greater than 120 kJ/m$^3$, as can be seen from the above discussion, the composition must be in the ranges of $0.04 \leq x \leq 0.10$, $0.11 \leq y \leq 0.15$, and $0.08 \leq z \leq 0.15$. In the case Ho or Dy was used as R, similar results were obtained (Data not shown).

EXAMPLE 2

The film deposition apparatus shown in FIG. 4 was used, and Nd—Tb, M fie—Co, Fe—Ni, or Fe—Co—Ni alloy), and an FeB alloy were employed as the targets 4a, 4b, and 4c, respectively. $(Nd_{0.93}Tb_{0.07})_yM_{1-y-z}B_z$ thin film magnets having a thickness of about 2 μm were formed on quartz glass substrates according to a procedure similar to that in Example 1 wherein the substrate temperature, the Ar gas pressure, and the deposition rate were 590° C., 8 Pa, and 8 μm/hr, respectively.

Table 6 shows the resultant magnetic characteristics measured perpendicular to the film plane for obtained thin film magnets. As can be seen from Table 6, the films show magnetic characteristics which are basically similar to those of the $(Nd_{0.93}Tb_{0.07})_yFe_{1-y-z}B_z$ thin film magnets described above with slight differences in the magnetic characteristics being observed depending on the changes in the Co and Ni compositions. The results show that any of the Fe-based alloys including Fe—Co, Fe—Ni, and Fe—Co—Ni may be employed as M to achieve a high maximum energy product greater than 120 kJ/m$^3$ as in the case wherein Fe metal is employed.

TABLE 6

| SAMPLE | COMPOSITION | RESIDUAL MAGNETIZATION (T) | COERCIVE FORCE | MAXIMUM ENERGY PRODUCT (kJ/m$^3$) |
|---|---|---|---|---|
| 1 | $(Nd_{0.93}Tb_{0.07})_{0.11}(Fe_{0.85}Co_{0.15})_{0.81}B_{0.08}$ | 1.10 | 640 | 203 |
| 2 | $(Nd_{0.93}Tb_{0.07})_{0.11}(Fe_{0.85}Co_{0.15})_{0.74}B_{0.15}$ | 1.01 | 824 | 168 |
| 3 | $(Nd_{0.93}Tb_{0.07})_{0.13}(Fe_{0.85}Co_{0.15})_{0.76}B_{0.11}$ | 1.03 | 752 | 171 |
| 4 | $(Nd_{0.93}Tb_{0.07})_{0.15}(Fe_{0.85}Co_{0.15})_{0.77}B_{0.08}$ | 1.02 | 688 | 178 |
| 5 | $(Nd_{0.93}Tb_{0.07})_{0.15}(Fe_{0.85}Co_{0.15})_{0.70}B_{0.15}$ | 0.92 | 856 | 149 |
| 6 | $(Nd_{0.83}Tb_{0.07})_{0.11}(Fe_{0.70}Co_{0.30})_{0.81}B_{0.08}$ | 1.05 | 632 | 196 |

TABLE 6-continued

| SAMPLE | COMPOSITION | RESIDUAL MAGNETIZATION (T) | COERCIVE FORCE | MAXIMUM ENERGY PRODUCT (kJ/m$^3$) |
|---|---|---|---|---|
| 7 | $(Nd_{0.83}Tb_{0.07})_{0.11}(Fe_{0.70}Co_{0.30})_{0.74}B_{0.15}$ | 0.98 | 808 | 160 |
| 8 | $(Nd_{0.83}Tb_{0.07})_{0.13}(Fe_{0.70}Co_{0.30})_{0.76}B_{0.11}$ | 0.98 | 720 | 165 |
| 9 | $(Nd_{0.83}Tb_{0.07})_{0.15}(Fe_{0.70}Co_{0.30})_{0.77}B_{0.08}$ | 1.00 | 672 | 170 |
| 10 | $(Nd_{0.83}Tb_{0.07})_{0.15}(Fe_{0.70}Co_{0.30})_{0.70}B_{0.15}$ | 0.89 | 832 | 144 |
| 11 | $(Nd_{0.93}Tb_{0.07})_{0.11}(Fe_{0.98}Co_{0.02})_{0.81}B_{0.08}$ | 1.05 | 632 | 189 |
| 12 | $(Nd_{0.93}Tb_{0.07})_{0.11}(Fe_{0.98}Co_{0.02})_{0.74}B_{0.15}$ | 0.97 | 800 | 154 |
| 13 | $(Nd_{0.93}Tb_{0.07})_{0.13}(Fe_{0.98}Co_{0.02})_{0.76}B_{0.11}$ | 0.99 | 728 | 162 |
| 14 | $(Nd_{0.93}Tb_{0.07})_{0.15}(Fe_{0.98}Co_{0.02})_{0.77}B_{0.08}$ | 1.00 | 696 | 168 |
| 15 | $(Nd_{0.93}Tb_{0.07})_{0.15}(Fe_{0.98}Co_{0.02})_{0.70}B_{0.15}$ | 0.87 | 808 | 137 |
| 16 | $(Nd_{0.93}Tb_{0.07})_{0.11}(Fe_{0.96}Co_{0.04})_{0.81}B_{0.08}$ | 1.03 | 648 | 180 |
| 17 | $(Nd_{0.93}Tb_{0.07})_{0.11}(Fe_{0.96}Co_{0.04})_{0.74}B_{0.15}$ | 0.95 | 824 | 153 |
| 18 | $(Nd_{0.93}Tb_{0.07})_{0.13}(Fe_{0.96}Co_{0.04})_{0.76}B_{0.11}$ | 0.97 | 712 | 158 |
| 19 | $(Nd_{0.93}Tb_{0.07})_{0.15}(Fe_{0.96}Co_{0.04})_{0.77}B_{0.08}$ | 1.00 | 672 | 164 |
| 20 | $(Nd_{0.93}Tb_{0.07})_{0.15}(Fe_{0.96}Co_{0.04})_{0.70}B_{0.15}$ | 0.86 | 864 | 133 |
| 21 | $(Nd_{0.93}Tb_{0.07})_{0.11}(Fe_{0.80}Co_{0.15}Ni_{0.05})_{0.81}B_{0.08}$ | 1.07 | 624 | 191 |
| 22 | $(Nd_{0.93}Tb_{0.07})_{0.11}(Fe_{0.80}Co_{0.15}Ni_{0.05})_{0.74}B_{0.15}$ | 0.99 | 792 | 161 |
| 23 | $(Nd_{0.93}Tb_{0.07})_{0.13}(Fe_{0.80}Co_{0.15}Ni_{0.05})_{0.76}B_{0.11}$ | 1.00 | 760 | 169 |
| 24 | $(Nd_{0.93}Tb_{0.07})_{0.15}(Fe_{0.80}Co_{0.15}Ni_{0.05})_{0.77}B_{0.08}$ | 0.98 | 720 | 177 |
| 25 | $(Nd_{0.93}Tb_{0.07})_{0.15}(Fe_{0.80}Co_{0.15}Ni_{0.05})_{0.70}B_{0.15}$ | 0.91 | 880 | 153 |

EXAMPLE 3

The film deposition apparatus shown in FIG. 4 was used. Nd-Tb, Fe metal, and an FeB alloy were employed as the targets 4a, 4b, and 4c, respectively, and $(Nd_{1-x}Tb_x)_yFe_{1-y-z}B_z$ thin film magnets having a thickness of about 2 µm were formed on quartz glass substrates in a manner similar to that in Example 1, wherein the substrate temperature, the Ar gas pressure, and the deposition rate were 510° to 590° C., 8 Pa, and 8 µm/hr, respectively.

Figure 7:
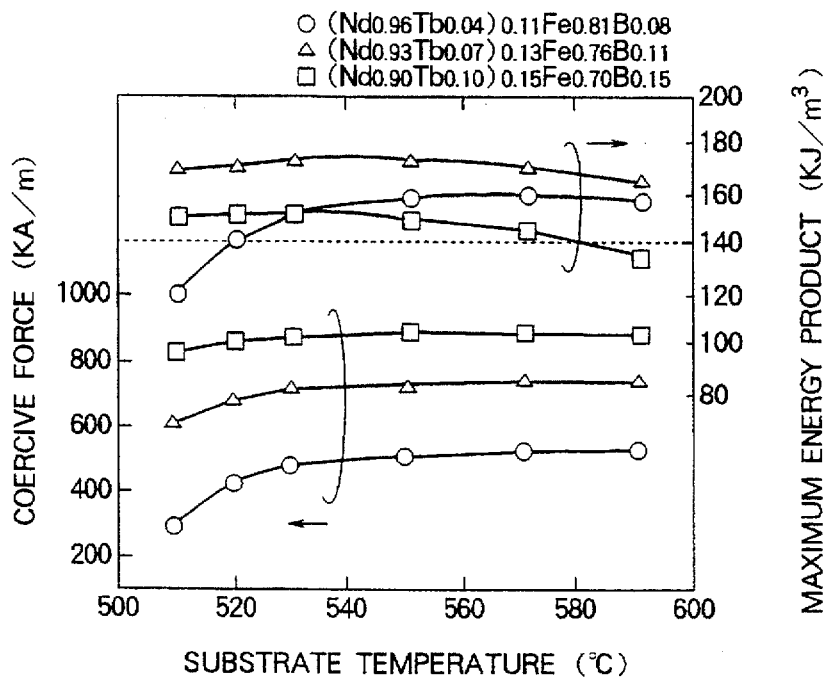
FIG. 7 shows a graph that illustrates the dependence of the magnetic characteristics of the thin film magnets obtained in Example 3 upon the substrate temperature according to the present invention.

FIG. 7 shows the magnetic characteristics of the thin film magnets obtained as a function of the substrate temperature upon. From FIG. 7, it can be seen that if a substrate temperature in the range from 530° to 570° C. is employed, it is possible to obtain particularly high coercive force and thus a large maximum energy product greater than at least 140 kJ/m$^3$.

EXAMPLE 4

In this example, $(Nd_{1-x}Tb_x)_yFe_{1-y-z}B_z$ thin film magnets were formed in a manner similar to Example 3, wherein the substrate temperature, the Ar gas pressure, and the deposition rate were 590° C., 8 Pa, and 0.05 to 20 µm/hr, respectively.

Figure 8:
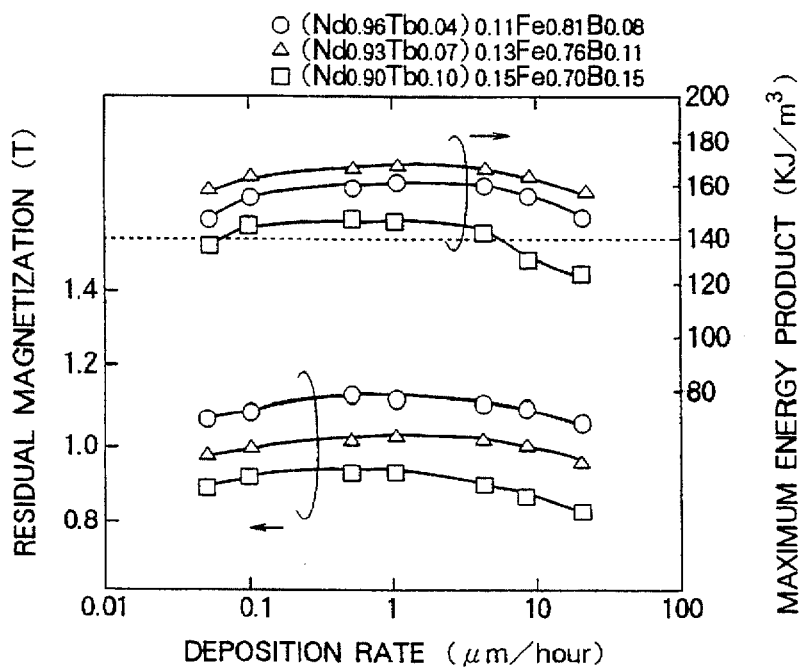
FIG. 8 shows a graph that illustrates the dependence of the magnetic characteristics of the thin film magnets obtained in Example 4 upon the deposition rate according to the present invention.

FIG. 8 shows the magnetic characteristics of the obtained thin film magnets as a function of the deposition rate. As can be seen from FIG. 8, if the deposition is performed at a deposition rate in the range from 0.1 to 4 µm/hr, it is possible to obtain particularly high residual magnetization and thus a maximum energy product greater than at least 140 kJ/m$^3$.

EXAMPLE 5

In this example, $(Nd_{1-x}Tb_x)_yFe_{1-y-z}B_z$ thin film magnets were formed in the same manner as in Example 3 except that the substrate temperature, the Ar gas pressure, and the deposition rate were 590° C., 0.05 to 20 Pa, 8 µm/hr; respectively.

Figure 9:
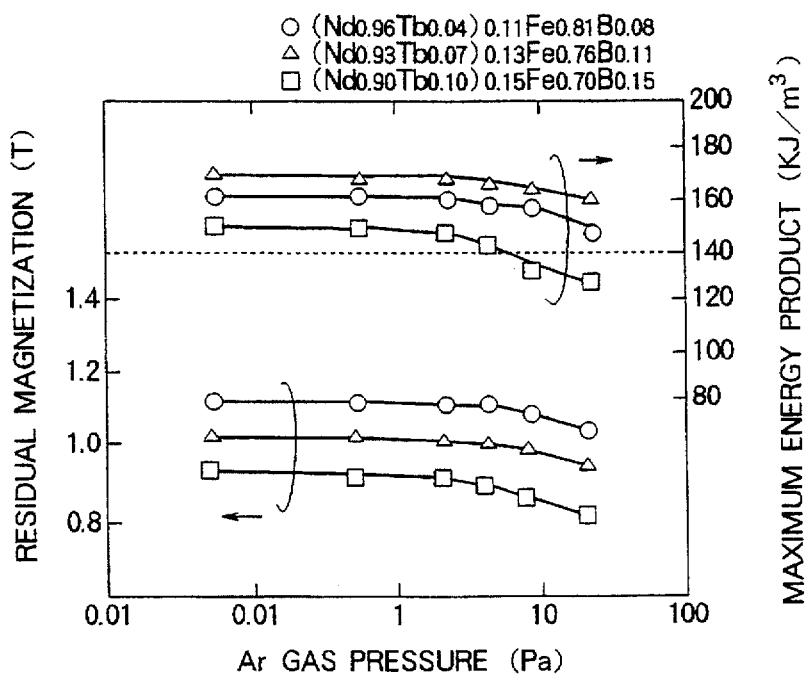
FIG. 9 shows a graph that illustrates the dependence of the magnetic characteristics of the thin film magnets obtained in Example 5 upon the Ar gas pressure according to the present invention.

FIG. 9 shows the magnetic characteristics of the obtained thin film magnets as a function of the Ar gas pressure. As can be seen from FIG. 9, if the deposition is performed at an Ar gas pressure in the range from 0.05 to 4 Pa, it is possible to obtain particularly high residual magnetization and thus a maximum energy product greater than at least 140 kJ/m$^3$.

EXAMPLE 6

$(Nd_{1-x}Tb_x)_yFe_{1-y-z}B_z$ thin film magnets were formed in the same manner as in Example 3 except that the substrate temperature, the Ar gas pressure, and the deposition rate were 530° to 570° C., 0.05 to 4 Pa, 0.1 to 4 µm/hr, respectively. The results are shown in Table 7.

TABLE 7

| SAMPLE | COMPOSITION | SUBSTRATE TEMP. (°C.) | Ar GAS PRESSURE (Pa) | DEPOSITION RATE (µm/hr) | MAXIMUM ENERGY PRODUCT (kJ/m$^3$) |
|---|---|---|---|---|---|
| 1 | $(Nd_{0.96}Tb_{0.04})_{0.11}Fe_{0.81}B_{0.08}$ | 530 | 0.05 | 4.0 | 182 |
| 2 | $(Nd_{0.96}Tb_{0.04})_{0.13}Fe_{0.76}B_{0.11}$ | 530 | 0.05 | 4.0 | 195 |
| 3 | $(Nd_{0.96}Tb_{0.04})_{0.15}Fe_{0.70}B_{0.15}$ | 530 | 0.05 | 4.0 | 166 |
| 4 | $(Nd_{0.90}Tb_{0.10})_{0.11}Fe_{0.81}B_{0.08}$ | 530 | 4.0 | 0.1 | 187 |
| 5 | $(Nd_{0.90}Tb_{0.10})_{0.13}Fe_{0.76}B_{0.11}$ | 530 | 4.0 | 0.1 | 176 |
| 6 | $(Nd_{0.90}Tb_{0.10})_{0.15}Fe_{0.70}B_{0.15}$ | 530 | 4.0 | 0.1 | 165 |
| 7 | $(Nd_{0.96}Tb_{0.04})_{0.11}Fe_{0.81}B_{0.08}$ | 570 | 0.05 | 0.1 | 188 |
| 8 | $(Nd_{0.96}Tb_{0.04})_{0.13}Fe_{0.76}B_{0.11}$ | 570 | 0.05 | 0.1 | 199 |
| 9 | $(Nd_{0.96}Tb_{0.04})_{0.15}Fe_{0.70}B_{0.15}$ | 570 | 0.05 | 0.1 | 168 |
| 10 | $(Nd_{0.90}Tb_{0.10})_{0.11}Fe_{0.81}B_{0.08}$ | 570 | 4.0 | 4.0 | 187 |
| 11 | $(Nd_{0.90}Tb_{0.10})_{0.13}Fe_{0.76}B_{0.11}$ | 570 | 4.0 | 4.0 | 175 |
| 12 | $(Nd_{0.90}Tb_{0.10})_{0.15}Fe_{0.70}B_{0.15}$ | 570 | 4.0 | 4.0 | 164 |
| 13 | $(Nd_{0.93}Tb_{0.07})_{0.13}Fe_{0.76}B_{0.11}$ | 550 | 2.0 | 4.0 | 204 |
| 14 | $(Nd_{0.93}Tb_{0.07})_{0.13}Fe_{0.76}B_{0.11}$ | 550 | 2.0 | 0.1 | 208 |
| 15 | $(Nd_{0.93}Tb_{0.07})_{0.13}Fe_{0.76}B_{0.11}$ | 550 | 0.05 | 2.0 | 220 |
| 16 | $(Nd_{0.93}Tb_{0.07})_{0.13}Fe_{0.76}B_{0.11}$ | 550 | 4.0 | 2.0 | 215 |

TABLE 7-continued

| SAMPLE | COMPOSITION | SUBSTRATE TEMP. (°C.) | Ar GAS PRESSURE (Pa) | DEPOSITION RATE (μm/hr) | MAXIMUM ENERGY PRODUCT (kJ/m$^3$) |
| --- | --- | --- | --- | --- | --- |
| 17 | $(Nd_{0.93}Tb_{0.07})_{0.13}Fe_{0.76}B_{0.11}$ | 530 | 2.0 | 2.0 | 212 |
| 18 | $(Nd_{0.93}Tb_{0.07})_{0.13}Fe_{0.76}B_{0.11}$ | 570 | 2.0 | 2.0 | 204 |
| 19 | $(Nd_{0.93}Tb_{0.07})_{0.13}Fe_{0.76}B_{0.11}$ | 550 | 2.0 | 2.0 | 214 |
| COMP.1 | $(Nd_{0.96}Tb_{0.04})_{0.15}Fe_{0.70}B_{0.15}$ | 600 | 2.0 | 2.0 | 150 |
| COMP.2 | $(Nd_{0.96}Tb_{0.04})_{0.15}Fe_{0.70}B_{0.15}$ | 550 | 8.0 | 2.0 | 156 |
| COMP.3 | $(Nd_{0.96}Tb_{0.04})_{0.15}Fe_{0.70}B_{0.15}$ | 550 | 2.0 | 8.0 | 151 |

As can be seen from Table 7, if the film deposition conditions are limited to within the ranges described above, it is possible to obtain very high coercive force and residual magnetization and thus a maximum energy product greater than at least 160 kJ/m$^3$. However, if the deposition conditions are not limited to within these ranges, it is impossible to obtain a maximum energy product greater than 160 kJ/m$^3$ as in the case of Comparative Samples 1 to 3.

Now, referring to the accompanying drawings, a cylindrical ferromagnetic thin film having radial anisotropy according to the present invention will be described below.

Figure 10:
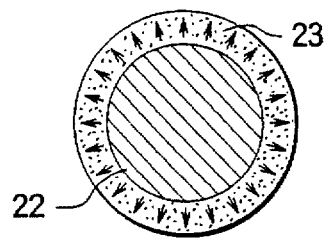
FIG. 10 shows a cross-sectional view that illustrates an embodiment of a ferromagnetic thin film in a cylindrical form according to the invention.
Figure 11:
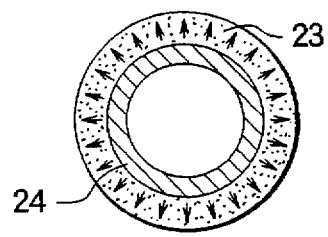
FIG. 11 shows a cross-sectional view that illustrates another embodiment of a ferromagnetic thin film in a cylindrical form according to the invention.
Figure 12:
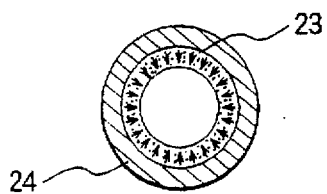
FIG. 12 shows a cross-sectional view that illustrates still another embodiment of a ferromagnetic thin film in a cylindrical form according to the invention.

FIG. 10 is a cross-sectional view of an embodiment of a cylindrical ferromagnetic thin film having radial anisotropy according to the invention. As shown in FIG. 10, a perpendicular magnetization film 23 is formed on the side wall of a columnar substrate 22. A cylinder may also be used as the substrate. In this case, a perpendicular magnetization film 23 may be deposited on either the outer side wall or the inner side wall of the cylindrical substrate 24 as shown in FIGS. 11 and 12. Alternatively, the cylindrical substrate may be removed after film deposition, so as to obtain a cylindrical ferromagnetic thin film consisting of only the deposited film.

The present invention does not particularly limit the thin film material as long as the material has strong anisotropic magnetic properties in the direction across the film thickness. Not only rare earth element-transition metal alloys, but also other various materials for example magnetic recording materials such as Co—Cr-based alloys and Ba-based ferrites, magneto-optic recording materials such as MnBi-based alloys and rare earth element-transition metal amorphous alloys are employed. More specifically, if (Nd, R)—M—B alloys are used as the thin film material, it is possible to obtain a cylindrical thin fill magnet having radial anisotropy and also having a large maximum energy product. As for the substrate material, various materials such as glass, metal, alloys, oxides, and nitrides may be employed without particular limitations.

Figure 13:
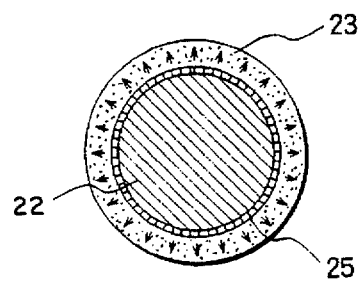
FIG. 13 shows a cross-sectional view that illustrates another embodiment of a ferromagnetic thin film in a cylindrical form having a buffer layer according to the invention.

Furthermore, if a buffer layer 25 is formed between the substrate and the thin film as shown in FIG. 13, it is possible to improve adhesion between the substrate and the thin film, and the radial anisotropy of the thin film is also improved. Whereas a material in a columnar form is used as the substrate in the example shown in FIG. 13, the buffer layer 25 may also be employed for the same purpose in the case where the substrate is in the cylindrical form. The invention has no particular limitation in the method of forming the thin film on the side wall of the substrate in the cylindrical or columnar form, as long as the method allows formation of a perpendicular magnetization film. Specific examples include sputtering, vacuum evaporation, and laser ablation techniques.

Referring now to a particular embodiment, the invention will be described in further detail below.

Figure 14:
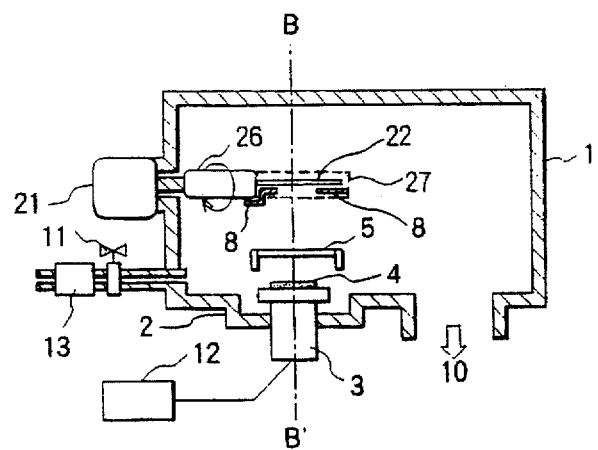
FIG. 14 shows a cross-sectional view that illustrates a film deposition apparatus for producing a ferromagnetic thin film in a cylindrical form according to the present invention.
Figure 15:
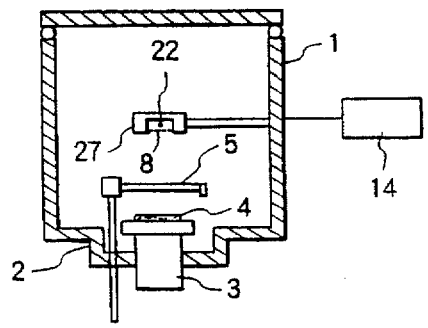
FIG. 15 shows a cross-sectional view that illustrates the apparatus of FIG. 14 taken along line B—B'.

FIG. 14 shows a cross-sectional view of a film deposition apparatus for producing a cylindrical ferromagnetic thin film with radial anisotropy, embodying the present invention. FIG. 15 shows a cross-sectional view of the apparatus shown in FIG. 14 taken along line B—B'. As shown in FIGS. 14 and 15, there is provided a boat 2 in a vacuum chamber 1 so that a film deposition mechanism is disposed on the boat 2. In the example shown in FIGS. 14 and 15, the film deposition mechanism is a sputtering mechanism including a cathode electrode 3, a 3 inch diameter target 4, and a shutter plate 5 that can be opened and closed. A holder 26 for holding a columnar substrate is disposed at a central position of the vacuum chamber 1 wherein a columnar substrate 22 having a diameter of 0.1 mm to 20 mm and a length of 10 mm to 100 mm can be attached to the holder 26. The substrate holder 26 can be rotated by a motor 21.

There is also provided a heater 27 for heating the columnar substrate. As for the heating method, either infrared heating or induction heating may be employed depending on the film material and the substrate material. Otherwise, a combination of infrared heating and induction heating may also be employed. Using this film deposition apparatus, a perpendicular magnetization thin film 23 is formed as follows. Deposition gas is introduced into the vacuum chamber 1 via a valve 11. The target 4 is then discharged while rotating the substrate holder 26 to which the columnar substrate 22 is attached, thereby sputtering the target 4 and thus forming a perpendicular magnetization thin film 23 having a uniform composition and a uniform thickness on the side wall of the columnar substrate 22. If a mask 8 is used, the thin film is formed via the mask 8 only in the desired areas on the columnar substrate 22. When the shutter 5 is closed, no film is deposited on the columnar substrate 22. The power applied to the target, the Ar gas pressure, and the substrate temperature are precisely controlled by a power controller 12, a mass flow controller 13, and a temperature controller 14, respectively.

Figure 16:
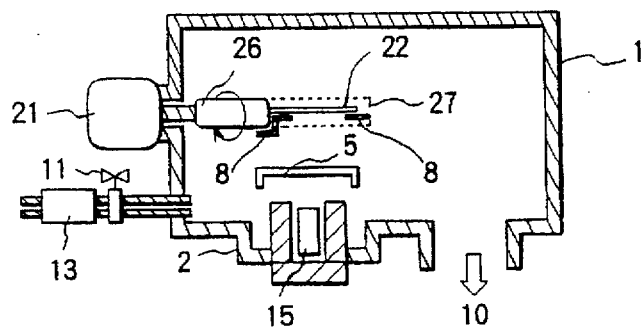
FIG. 16 shows a cross-sectional view that illustrates another film deposition apparatus for producing a ferromagnetic thin film in a cylindrical form according to the present invention.
Figure 17:
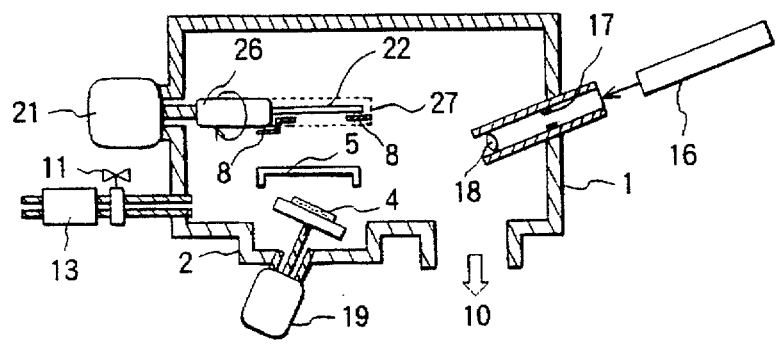
FIG. 17 shows a cross-sectional view that illustrates still another film deposition apparatus for producing a ferromagnetic thin film in a cylindrical form according to the present invention.

Whereas sputtering is employed as the film deposition technique in the above example, a vacuum evaporation technique may also be employed for the same purpose. In this case, an evaporation source 15 is put on the boat 2 as shown in FIG. 16. Furthermore, a laser ablation technique may also be employed for the same purpose. In this case, as shown in FIG. 17, a laser beam is emitted by a laser source 16 and passed through a slit 17. The laser beam is then focused onto a target 4 via a lens 18 thereby ablating the target 4 which is rotated by a target rotating mechanism 19 and thus forming a film on a columnar substrate 22. Although a columnar substrate 22 was employed in the above example, it is also possible to deposit a film on the outer side wall in the case wherein the cylindrical substrate 24 is employed.

Figure 18:
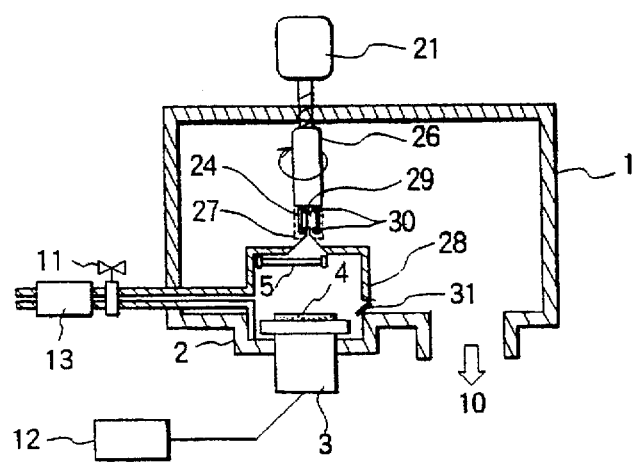
FIG. 18 shows a cross-sectional view that illustrates another film deposition apparatus for producing a ferromagnetic thin film in a cylindrical form according to the present invention.

It is also possible to deposit a film on the inner side wall of the cylindrical substrate 24. In this case, an apparatus such as that shown in FIG. 18 having a sputtering chamber 28 and a nozzle 29 inside a vacuum chamber 1 is used. The nozzle 29 is inserted into the cylindrical substrate 24, and the cylindrical substrate 24 is rotated. Under this condition, if the shutter plate 5 is opened, sputtered substances are ejected through the nozzle 29 onto the inner side wall of the cylindrical substrate 24 thereby depositing a film thereon. A mask 30 may be used to deposit the film only on the desired areas of the inner side wall of the cylindrical substrate 24. The ejection rate of the sputtered substances through the nozzle 29 can be controlled by adjusting the evacuation conductance via a variable valve 31 disposed in the sputtering chamber 28.

EXAMPLE 7

The film deposition apparatus shown in FIG. 14 was employed, and a sintered alloy of Nd—Fe—B serving as the target 4 was attached to the cathode electrode 3. A cylindrical or columnar WC (tungsten carbide) substrate having an outer diameter of 3 mm or 0.9 mm and a length of 30 mm was then attached to the substrate holder 26. The inside of the vacuum chamber 1 was then evacuated to a pressure less than $1 \times 10^{-4}$ Pa via a pumping system 10. The WC substrate was then heated by the heater 27° to 560° C. After the temperature of the substrate became stable, Ar gas was introduced into the vacuum chamber 1, so that the gas pressure was maintained at 1 Pa. The substrate holder 26 was rotated by the motor 21. While maintaining the shutter plate 5 in a closed state, a voltage was applied to the target 4 to initiate discharging of the target. Under this condition, the target was sputtered for 5 to 15 minutes so as to remove the oxide present on the surface of the target 4. The shutter plate 5 was then opened and thus film deposition onto the side wall of the cylindrical or columnar substrate was begun. The film deposition was performed for a predetermined time period. After the completion of the film deposition, the discharging of the target 4, the supplying of Ar gas, and the heating of the substrate by means of the heater were all stopped simultaneously. While evacuating the inside of the vacuum chamber 1, the substrate remaining in the vacuum chamber 1 was cooled at a slow cooling rate. Thus, an Nd-Fe-B thin film in a cylindrical form was obtained.

Table 8 shows designed and measured dimensions of the cylindrical Nd—Fe—B ferromagnetic thin films. As can be seen from Table 8, the obtained films deviated on the order of only 1 μm from an ideal circular shape and also have high dimensional accuracy of a similar order. The thickness of the magnet can be controlled with an accuracy of ±0.05 μm. Therefore, it is possible to achieve even smaller deviations from an ideal circular shape on the order of submicrons.

TABLE 8

| SAMPLE | PARAMETER | DESIGNED VALUE (μm) | MEASURED VALUE (μm) |
|---|---|---|---|
| 1 | OUTER DIAMETER | 3010.0 | 3009.1–3011.2 |
|   | DEVIATION FROM IDEAL CIRCLE | 0 | 1.6 |
|   | THICKNESS | 10.0 | 9.95–10.05 |
| 2 | OUTER DIAMETER | 910.0 | 909.0–9011.3 |
|   | DEVIATION FROM IDEAL CIRCLE | 0 | 1.7 |
|   | THICKNESS | 10.0 | 9.95–10.05 |

The radial anisotropy of the Nd—Fe—B ferromagnetic thin films in cylindrical form was evaluated by means of X-ray diffraction analysis. Ten positions were marked at equal intervals along the circumference at the center of the cylindrical ferromagnetic thin film in the longitudinal direction. Each of these ten marked positions was illuminated with an X-ray beam having a diameter of 10 μm, so that X-ray diffraction patterns were obtained.

Figure 19:
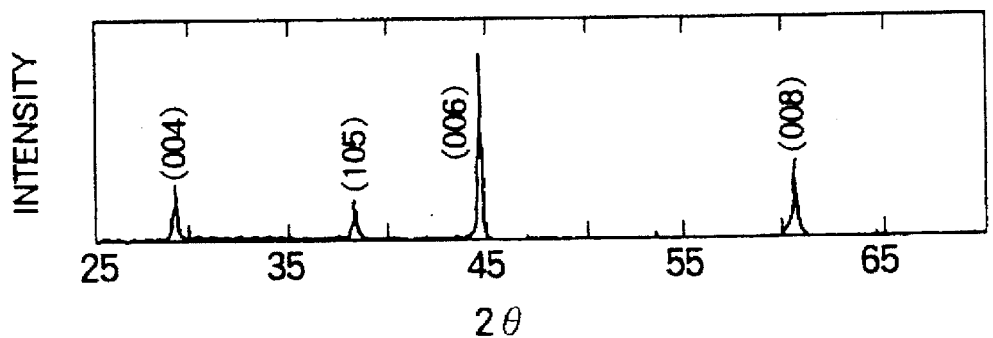
FIG. 19 shows a diagram that illustrates an X-ray diffraction pattern of the ferromagnetic thin film in a cylindrical form obtained in Example 7 according to the present invention.

FIG. 19 illustrates a typical X-ray diffraction pattern. From FIG. 19, it can be seen that the C-axis of the $Nd_2Fe_{14}B$ crystal is oriented in the direction across the film thickness. This means that the obtained film is a perpendicular magnetization film. All marked points showed similar diffraction patterns, which means that the obtained cylindrical film has radially anisotropic magnetic properties. Thus, in this example, a cylindrical magnetic thin film with radial anisotropy having a size on the order of a millimeter or submillimeter was obtained.

EXAMPLE 8

In this example, the film deposition apparatus shown in FIG. 14 was employed, and a sintered alloy of Nd—Fe—B, a Co—Cr alloy, a Ba ferrite, or (Nd, Tb)—Fe—B was used as the target 4. According to a procedure similar to that in Example 7, cylindrical ferromagnetic thin films having a thickness of about 1 μm were deposited on the side wall of cylindrical or columnar substrates made of various materials with an outer diameter of 3 mm and a length of 30 mm wherein the deposition was performed at a substrate temperature of 560° C. and at an Ar gas pressure of 1 Pa for all samples except for the Co-Cr alloy in which the substrate temperature was kept at 300° C. Table 9 shows the results of the radial anisotropy of the cylindrical ferromagnetic thin films obtained. The radial anisotropy was evaluated on the basis of the X-ray diffraction patters obtained in a manner similar to Example 7. That is, ten positions on each cylindrical film were marked, and X-ray diffraction measurement was performed at each of these points. The total peak density $\Sigma I$ relating to the ferromagnetic compounds forming the main phase of each film, and the peak intensity $I_{(00m)}$ (m: integer in the range of from 1 to 10) relating to the C-plane were determined. The ratios $\Sigma I_{(00m)}/\Sigma I$ were calculated. The averaged value for each sample is shown in Table 9.

TABLE 9

| SAMPLE | FILM MATERIAL | SUBSTRATE* | RADIAL ANISOTROPY |
|---|---|---|---|
| 1 | Nd—Fe—B | quartz glass | 0.93 |
| 2 | Nd—Fe—B | quartz glass(*) | 0.93 |
| 3 | Nd—Fe—B | $Al_2O_3$ | 0.92 |
| 4 | Nd—Fe—B | Fe | 0.89 |
| 5 | Nd—Fe—B | Fe—Ni | 0.88 |
| 6 | Nd—Fe—B | Fe—Co | 0.91 |
| 7 | Nd—Fe—B | TiN | 0.90 |
| 8 | Co—Cr | quartz glass | 0.93 |
| 9 | Ba ferrite | quartz glass | 0.89 |
| 10 | (Nd, Tb)—Fe—B | quartz glass | 0.93 |
| 11 | (Nd, Tb)—Fe—B | Fe—Ni | 0.90 |
| 12 | (Nd, Tb)—Fe—B | TiN | 0.92 |

*: The Substrate marked with (*) is a cylindrical substrate and others are columnar substrate.

As can be seen from Table 9, all the Nd-Fe-B thin films deposited on any type of columnar substrate showed high radial anisotropy greater than 0.88. This means that a variety of materials such as glass, metal, alloys, oxides, and nitrides can be employed as the substrate. The Co—Cr and Ba ferrite thin films also showed high radial anisotropy. This apparently means that not only rare earth element-transition metal based alloys such as Nd—Fe—B, but also vertical magnetic recording materials such as Co—Cr alloys, and Ba ferrites, and magneto-optic recording materials may also be employed as the thin film material. In particular, as can be seen from Table 9 and Tables 5 and 6 described above, if (Nd, R)—M—B alloys according to the present invention are used, it is possible to obtain a cylindrical thin film magnet having high radial anisotropy and also having a high maximum energy product.

EXAMPLE 9

In this example, the film deposition apparatus shown in FIG. 14 was employed. Using a $SiO_2$ target 4, a $SiO_2$ buffer layer having a thickness of about 0.5 μm was deposited on the side wall of a Cu columnar substrate according to a procedure similar to that in Example 7, wherein deposition was performed at a substrate temperature of 100° C. and at an Ar gas pressure of 2 Pa. After completing the deposition of the $SiO_2$ buffer layer, the target was switched to a sintered Nd—Fe—B alloy, and an Nd—Fe—B cylindrical thin film having a thickness of about 2 μm was deposited on the $SiO_2$ buffer layer at a substrate temperature of 560° C. and at an Ar gas pressure of 4 Pa. Table 10 shows the adhesion between the substrate and the Nd—Fe—B cylindrical thin film. For comparison, adhesion for a sample in which a Nd—Fe—B thin film was directly deposited on a Cu columnar substrate without a buffer layer is also shown in Table 10. Adhesion was evaluated by means of a tape peeling test. That is, after sticking tape to the Nd—Fe—B cylindrical thin films, the tape was removed at a constant speed and at a constant angle, and adhesion was evaluated by judging whether the cylindrical thin films peeled off the substrates.

TABLE 10

| SAMPLE | SUBSTRATE MATERIAL | BUFFER LAYER | ADHESION (TAPE PEELING TEST) |
|---|---|---|---|
| THIS EMBODIMENT | Cu | $SiO_2$ | no peeling |
| COMPARATIVE SAMPLE | Cu | none | almost entire film peeled off |

As can be seen from Table 10, the comparative sample was poor in adhesion and thus almost the whole cylindrical thin film peeled off. In contrast, the sample according to the invention shows no peeling of the cylindrical thin film since the buffer layer enhances adhesion between the thin film and the substrate.

EXAMPLE 10

Deposition was performed using the film deposition apparatus shown in FIG. 14 with a Ti or Zr metal target 4. According to a procedure similar to that in Example 7, a Ti or Zr buffer layer having a thickness of about 0.5 μm was deposited on a quartz or Fe columnar substrate wherein the deposition was performed at a substrate temperature of 200° C. and at an Ar gas pressure of 2 Pa. After completing the deposition of the buffer layer, the target was switched to a Co—Cr alloy, and a Co—Cr cylindrical thin film having a thickness of about 1 μm was deposited on the buffer layer at a substrate temperature of 300° C. and at an Ar gas pressure of 5 Pa. The remits are shown in Table 11 not only for samples having a buffer layer but also for comparative samples having no buffer layer.

TABLE 11

| SAMPLE | SUBSTRATE MATERIAL | BUFFER LAYER | RADIAL ANISOTROPY |
|---|---|---|---|
| 1 | quartz glass | Ti | 0.99 |
| 2 | quartz glass | Zr | 0.98 |
| 3 | Fe | Ti | 0.99 |
| COMP. 1 | quartz glass | none | 0.93 |
| COMP. 2 | Fe | none | 0.92 |

The results shown in Table 11 indicate that the buffer layer formed on the columnar substrate leads to an improvement in the radial anisotropy.

What is claimed is:

1. An article comprising a structure having a coating thereon comprising a thin film magnet produced by means of physical vapor deposition, said thin film magnet comprising an $(Nd_{1-x}R_x)_yM_{1-y-z}B_z$ alloy having a ferromagnetic compound comprising $Nd_2Fe_{14}B$ as its main phase, wherein R is at least one element selected from the group consisting of Tb, Ho, and Dy and M is Fe metal or an Fe-based alloy consisting of at least one element selected from the group consisting of Co and Ni, $0.04 \leq x \leq 0.10$, $0.11 \leq y \leq 0.15$, and $0.08 \leq z \leq 0.15$.

2. A method for producing an article comprising a thin film magnet by forming a thin film magnet on a substrate placed in a vacuum chamber, said thin film magnet comprising an $(Nd_{1-x}R_x)_yM_{1-y-z}B_z$ alloy having a ferromagnetic compound comprising $Nd_2Fe_{14}B$ as its main phase, wherein R is at least one element selected from the group consisting of Tb, Ho, and Dy and M is Fe metal or an Fe-based alloy including at least one element selected from the group consisting of Co and Ni, $0.04 \leq x \leq 0.10$, $0.11 \leq y \leq 0.15$, and $0.08 \leq z \leq 0.15$.

3. A method according to claim 2, wherein said substrate is heated to a temperature in the range of from about 530° to about 570° C. during said formation step.

4. A method according to claim 2, wherein the deposition rate of said magnetic thin film during said formation step is in the range of from about 0.1 to about 4 μm/hr.

5. A method according to claim 2, wherein said formation step is carried out at a gas pressure in the range of from about 0.05 to about 4 Pa.

6. An article comprising: a cylindrical or columnar substrate, and a perpendicular magnetization film deposited on the side wall of said substrate, said ferromagnetic thin film having radial anisotropic magnetic properties.

7. An article according to claim 6, wherein said perpendicular magnetization film is a thin film magnet comprising an $(Nd_{1-x}R_x)_yM_{1-y-z}B_z$ alloy having a ferromagnetic compound comprising $Nd_2Fe_{14}B$ as its main phase, wherein R is at least one element selected from the group consisting of Tb, Ho, and Dy and M is Fe metal or an Fe-based alloy including at least one element selected from the group consisting of Co and Ni, $0.04 \leq x \leq 0.10$, $0.11 \leq y \leq 0.15$, and $0.08 \leq z \leq 0.15$.

8. An article according to claim 6, wherein a buffer layer is formed between said substrate and said perpendicular magnetization film.

9. A method for producing a ferromagnetic thin film in cylindrical form on a substrate by means of physical vapor deposition, said method including the steps of heating a cylindrical or columnar substrate, and depositing a perpendicular magnetization film on the side wall of said substrate.

10. A method for producing a ferromagnetic thin film in cylindrical form according to claim 9, wherein said perpendicular magnetization film is a thin film magnet comprising an $(Nd_{1-x}R_x)_yM_{1-y-z}B_z$ alloy having a ferromagnetic compound comprising $Nd_2Fe_{14}B$ as its main phase, wherein R is at least one element selected from the group consisting of Tb, Ho, and Dy and M is Fe metal or an Fe-based alloy including at least one element selected from the group consisting of Co and Ni, $0.04 \leq x \leq 0.10$, $0.11 \leq y \leq 0.15$, and $0.08 \leq z \leq 0.15$.

11. A method for producing a ferromagnetic thin film in cylindrical form according to claim 9, further including the step of forming a buffer layer between said substrate and said perpendicular magnetization film.

12. A method for producing a ferromagnetic thin film in cylindrical form according to claim 9, wherein said substrate is heated to a temperature in the range of from about 530° to about 570° C. during said heating step.

13. A method for producing a ferromagnetic thin film in cylindrical form according to claim 9, wherein the deposition rate of said magnetic thin film during said depositing step is in the range of from about 0.1 to about 4 μm/hr.

14. A method for producing a ferromagnetic thin film in cylindrical form according to claim 9, wherein said depositing step is carried out at a gas pressure in the range of from about 0.05 to about 4 Pa.

15. A method for producing a ferromagnetic thin film in cylindrical form according to claim 9 comprising producing a ferromagnetic thin film having radial anisotropic magnetic properties.

* * * * *